(12) United States Patent
Nakashima

(10) Patent No.: US 6,281,965 B1
(45) Date of Patent: Aug. 28, 2001

(54) EXPOSURE METHOD AND EXPOSURE SYSTEM USING THE EXPOSURE METHOD

(75) Inventor: Toshiharu Nakashima, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/357,847

(22) Filed: Jul. 21, 1999

Related U.S. Application Data (62) Division of application No. 09/148,416, filed on Sep. 4, 1998, now Pat. No. 5,976,738, and a continuation of application No. 08/911,359, filed on Aug. 7, 1997, now abandoned, and a continuation of application No. 08/584,703, filed on Jan. 11, 1996, now abandoned, and a continuation of application No. 08/378,248, filed on Jan. 24, 1995, now abandoned.

(30) Foreign Application Priority Data

Jan. 27, 1994 (JP) .................................. 6-007446

(51) Int. Cl.⁷ .......................... G03B 27/42; G03B 27/52; G03F 9/00
(52) U.S. Cl. ................ 355/53; 355/55; 355/77; 430/22
(58) Field of Search ................ 430/22, 30; 355/53, 355/55, 77, 43, 46, 54

(56) References Cited

U.S. PATENT DOCUMENTS

| | | | |
|---|---|---|---|
| 4,489,241 | * | 12/1984 | Matsuda et al. .................. 250/491.1 |
| 4,677,301 | * | 6/1987 | Tanimoto et al. .................. 250/548 |
| 4,734,746 | * | 3/1988 | Ushida et al. .................. 355/53 |
| 4,833,621 | * | 5/1989 | Umatate .................. 364/491 |
| 5,117,255 | * | 5/1992 | Shiraishi et al. .................. 355/53 |
| 5,305,222 | * | 4/1994 | Nakamura .................. 364/468 |
| 5,407,763 | * | 4/1995 | Pai .................. 430/5 |
| 5,498,501 | * | 3/1996 | Shimoda et al. .................. 430/22 |
| 5,654,792 | * | 8/1997 | Yonekawa .................. 355/53 |
| 5,699,260 | * | 12/1997 | Lucas et al. .................. 364/468.28 |
| 5,973,766 | * | 10/1999 | Matsuura et al. .................. 355/52 |
| 5,976,738 | * | 11/1999 | Nakashima .................. 430/22 |
| 5,989,761 | * | 11/1999 | Kawakubo et al. .................. 430/22 |
| 6,016,391 | * | 1/2000 | Facchini et al. .................. 395/500.22 |
| 6,021,267 | * | 2/2000 | Bonn et al. .................. 395/500.22 |

* cited by examiner

Primary Examiner—Russell Adams
Assistant Examiner—Roy Fuller
(74) Attorney, Agent, or Firm—Miles & Stockbridge P.C.

(57) ABSTRACT

An exposure system comprises a first exposure apparatus having a first exposure field and a second exposure apparatus having a second exposure field larger than the first exposure field. A first shot map forming device is provided in the first exposure apparatus to form a first shot map by dividing an exposure region on a photosensitive substrate in units of first shot areas each corresponding to the first exposure field. A control unit transfers information on the first shot map to the second exposure apparatus. A second shot map forming device is provided in the second exposure apparatus to form a second shot map, based on the information on the first shot map, so that a number of shots becomes minimum when an exposure region including the first shot map on the photosensitive substrate is divided in units of second shot areas each corresponding to the second exposure field. A manufacturing method provides apparatus used in the exposure system.

67 Claims, 6 Drawing Sheets

EXPOSURE METHOD AND EXPOSURE SYSTEM USING THE EXPOSURE METHOD

CROSS-REFERENCE TO RELATED APPLICATIONS:

This application is a division of Application Ser. No. 09/148,416 filed Sep. 4, 1998 now U.S. Pat. No. 5,976,738, which is a continuation of application Ser. No. 08/911,359 filed Aug. 7, 1997 now abandoned, which is a continuation of Application Ser. No. 08/584,703 filed Jan. 11, 1996 now abandoned, which is a continuation of application Ser. No. 08/378,248 filed Jan. 24, 1995.

BACKGROUND OF THE INVENTION

1. Field of the Invention

The present invention relates to an exposure method for exposure of mask pattern on a photosensitive substrate in fabricating semiconductor devices etc., and an exposure system using the exposure method. Particularly, the invention is suitably applicable to the photolithography process wherein sequential exposures are effected in a layer as called as a middle layer not requiring a so high resolution, which is for example an ion-implanted layer used in fabricating semiconductor memories etc., and in a layer as called as a critical layer requiring a high resolution.

2. Related Background Art

The reduction projection exposure apparatus (steppers etc.) have been heretofore used in the photolithography process for fabricating the semiconductor devices such as VLSI, or liquid crystal displays etc. Generally, the semiconductor devices such as VLSI are formed by superimposing many patterns in layers on a wafer, and among those layers a layer requiring the highest resolution is called as a critical layer. In contrast with it, a layer not requiring a so high resolution, for example the ion-implanted layer used in fabricating semiconductor memories etc., is called as a middle layer. In other words, line widths of pattern in exposure in the middle layer are wider than those in exposure in the critical layer.

For example, recent VLSI fabrication plants often use separate exposure units for different layers each in its proper exposure in a fabrication process of a type of VLSI in order to enhance the throughput of fabrication steps. For example in the cases of fabricating VLSI having both the critical layer and the middle layer, a projection exposure apparatus with high resolution for critical layer was used also in exposure in the middle layer, or for exposure in the middle layer an exposure apparatus of the aligner type was used to effect full exposure on a single wafer. In the case of the former, an array (shot map) of shot areas in the middle layer was the same as that in the critical layer, whereby obviating the necessity to produce a new shot map for middle layer. Further, the latter also obviated the necessity to produce the shot map.

In the conventional technology as described above, the projection exposure apparatus for critical layer is ready for high resolutions. Therefore, when the exposure in the middle layer was effected by the projection exposure apparatus for critical layer, a reduction ratio of a projection optical system was too high, which narrows the field size, causing a problem of incapability to increase the throughput. Namely, the number of shot areas to be exposed on a wafer became too large with the narrow field size, requiring a longer exposure time in proportion to the number of shot areas. There was another problem that because the projection optical system with high resolution was expensive, the whole of the plural exposure units, used in fabricating a type of VLSI etc., became expensive.

When the exposure in the middle layer was conducted by the exposure apparatus of the aligner type, there was a problem that a sufficient resolution was not assured for large-scale wafers.

Also, high registration accuracy needs to be maintained in overlap exposures in different layers on VLSI. In order to enhance the registration accuracy as required, alignment marks (wafer marks) are formed in a predetermined array on a wafer, and alignment of wafer is carried out based on positions of these wafer marks. Accordingly, the time necessary for alignment also needs to be shortened in order to enhance the throughput of exposure steps.

SUMMARY OF THE INVENTION

In view of the above points, an object of the present invention is to provide an exposure method by which, in fabricating a substrate with a critical layer and a middle layer mixed therein by the photolithography process, exposures can be effected in respective layers each in its necessary resolution even for large-scale substrates and by which the exposures can be made with a high throughput using inexpensive exposure units. In addition, another object of the present invention is to provide an exposure system which can carry out the exposure method. A further object of the present invention is to provide an exposure method which can further enhance the throughput while decreasing the alignment time.

The exposure method according to the present invention is an exposure method for effecting overlap exposures of different mask patterns in an exposure area on a photosensitive substrate, using, for example as shown in FIG. 1 and FIGS. 2A–2C, a first exposure apparatus having a first exposure field and a second exposure apparatus having a second exposure field larger than the first exposure field, wherein in an exposure of a first mask pattern in the exposure area on the photosensitive substrate using the first exposure apparatus, the exposure is effected according to a first shot map formed by dividing the exposure area on the photosensitive substrate in units of first shot areas each corresponding to the first exposure field and wherein in an exposure of a second mask pattern in the exposure area on the photosensitive substrate using the second exposure apparatus, the exposure is effected according to a second shot map (FIG. 2C) having a shot number being minimum when a region containing the first shot map is divided in units of second shot areas each corresponding to the second exposure field.

In this case, an example of the second shot areas forming the second shot map is such an arrangement that the second shot areas each are constructed in units of first shot areas in those forming the first shot map.

Figure 5A:
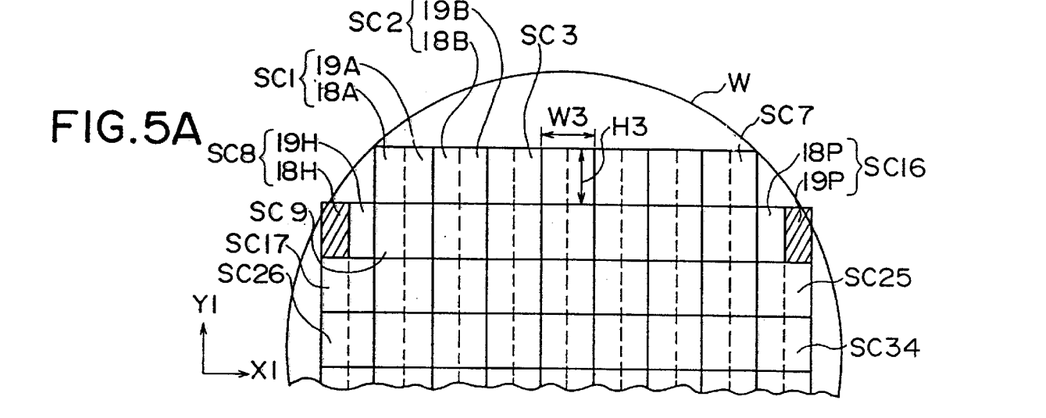
FIG. 5A is a plan view to show a shot map for critical layer on a wafer in the second embodiment.
Figure 5B:
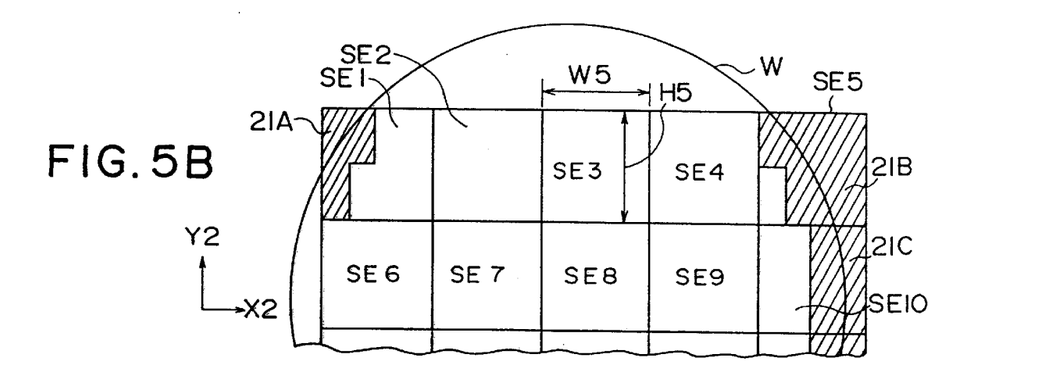
FIG. 5B is a plan view to show a shot map for middle layer, directly corresponding to FIG. 5A.
Figure 5C:
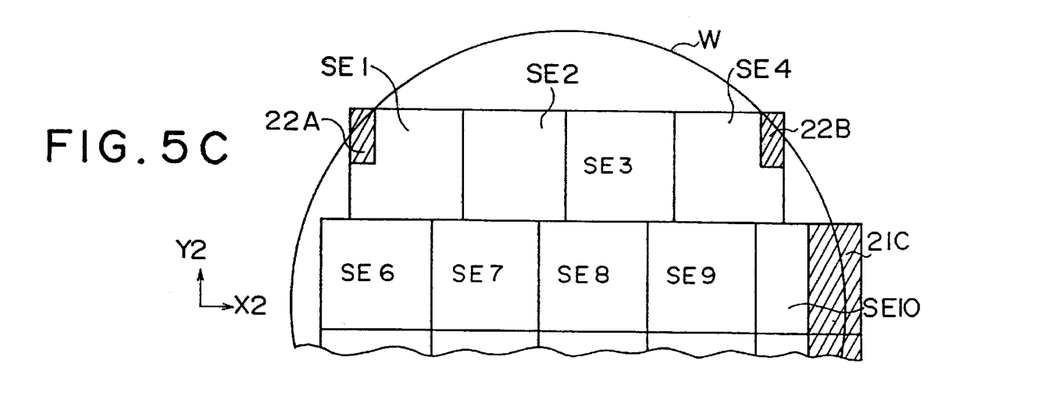
FIG. 5C is a plan view to show a shot map for middle layer minimized in the number of shot areas.

In another case, for example as shown in FIGS. 5A–5C, where an exposure of a plurality of same partial patterns is effected in each of the first shot areas forming the first shot map, the second shot areas forming the second shot map each are preferably separated in units of exposure regions of the partial patterns in the first shot areas forming the first shot map.

Figure 6A:
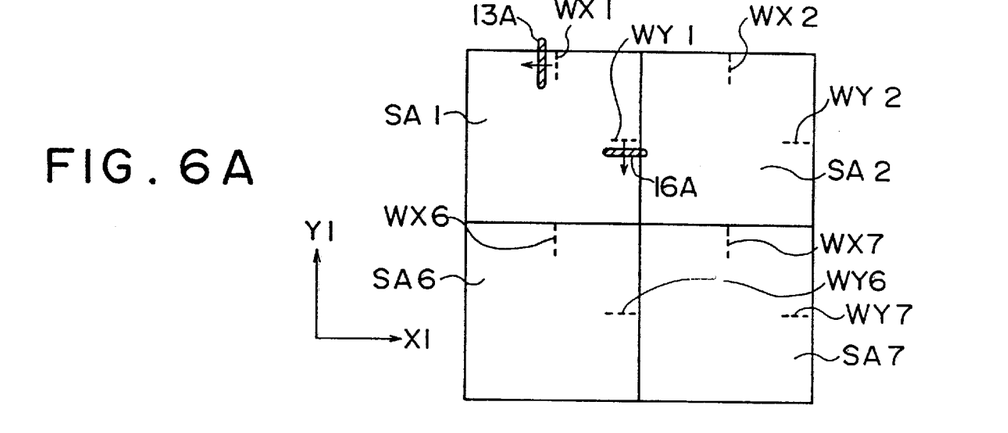
FIG. 6A is an enlarged plan view to show an example of layout of wafer marks in the critical layer in a third embodiment of the present invention.
Figure 6B:
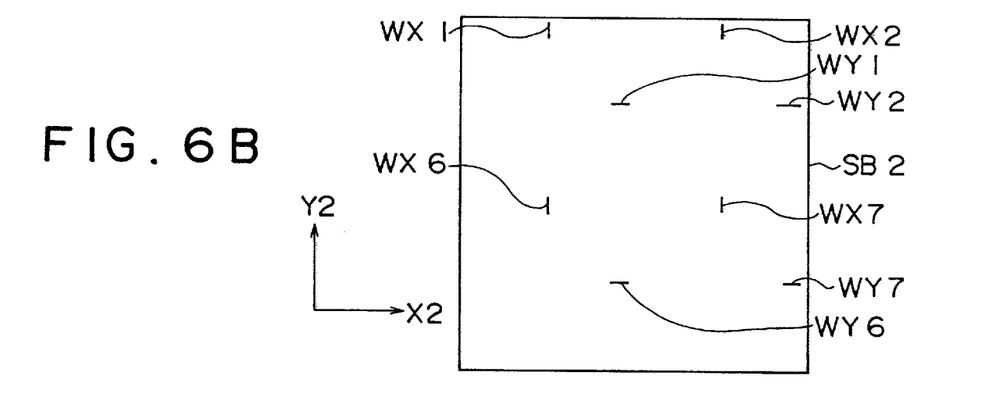
FIG. 6B is an enlarged plan view to show a layout of wafer marks in a shot area in the middle layer, corresponding to FIG. 6A.
Figure 6C:
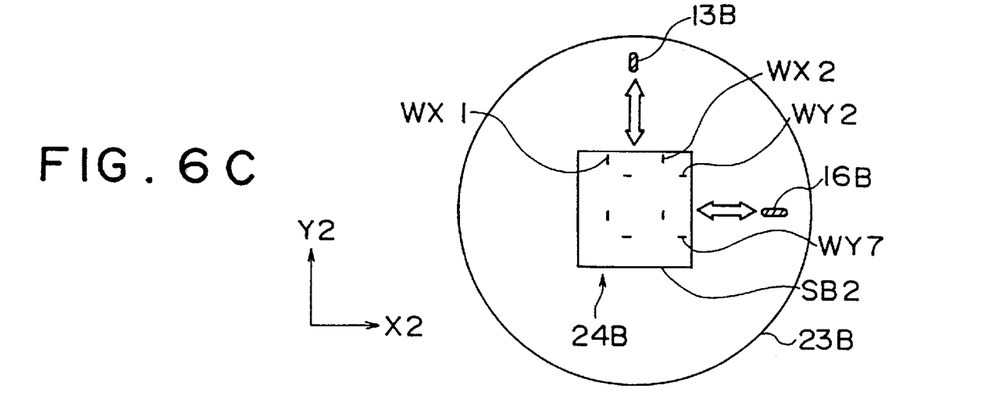
FIG. 6C is a drawing to show an effective exposure field of stepper for middle layer.

Another preferable arrangement is, for example as shown in FIGS. 6A–6C, such that alignment marks are formed in a predetermined array in the first shot map on the photosensitive substrate, exposures are effected according to the first shot map on the photosensitive substrate with the first exposure apparatus, and thereafter for exposures according to the second shot map with the second exposure apparatus, alignment is made between the second exposure field and each shot area in the second shot map, using an alignment mark closest to a measurement position of the second exposure apparatus out of the alignment marks in the first shot map.

Figure 1:
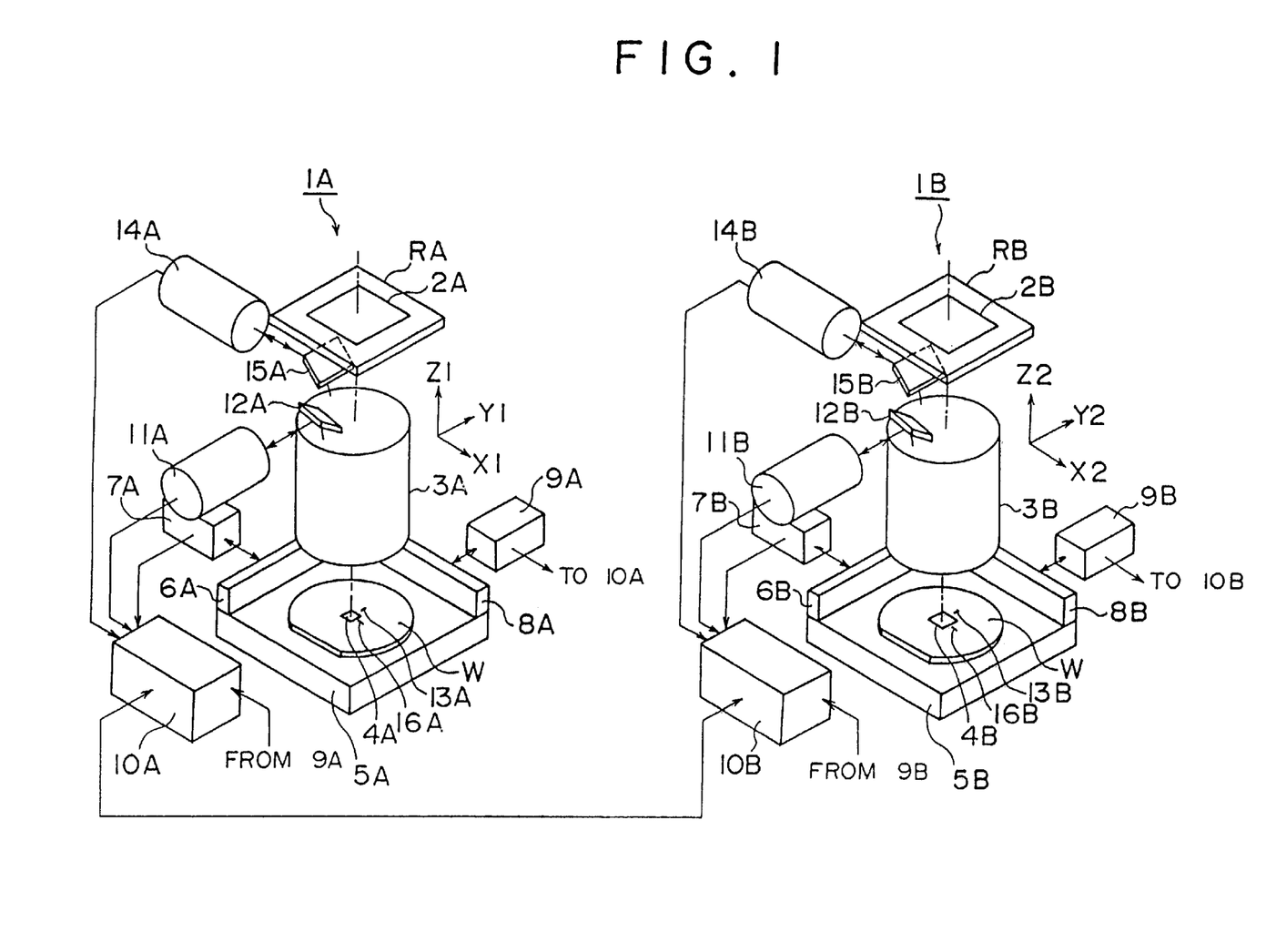
FIG. 1 is a perspective view to show an exposure system of a first embodiment of the present invention.

Further, the exposure system according to the present invention is an exposure system, for example as shown in FIG. 1, having a first exposure apparatus with a first exposure field and a second exposure apparatus with a second exposure field larger than the first exposure field, and effecting exposures in an exposure area on a photosensitive substrate with superposition of different mask patterns using the first exposure apparatus and second exposure apparatus in order, said exposure system comprising first shot map forming means, provided in the first exposure apparatus, for forming a first shot map by dividing the exposure area on the photosensitive substrate in units of first shot areas each corresponding to the first exposure field, control means for transferring information on the first shot map to the second exposure apparatus, and second shot map forming means for forming a second shot map, based on the information on the first shot map, so that a number of shots therein becomes minimum when the region containing the first shot map on the photosensitive substrate is divided in units of second shot areas each corresponding to the second exposure field, wherein an exposure is effected according to the first shot map with the first exposure apparatus whereas an exposure is effected according to the second shot map with the second exposure apparatus.

In such exposure method and exposure system of the present invention, the apparatus are used as follows for subsequent exposures in the critical layer and the middle layer on the photosensitive substrate. The critical layer is exposed using the first exposure apparatus of a high resolution having the first exposure field. The middle layer is exposed using the exposure apparatus having the larger exposure field, i.e., the second exposure apparatus of a low magnification and a low resolution. The second exposure apparatus, which has the low magnification and which performs exposure in a relatively low resolution over a wide area, will be called as an exposure apparatus for middle layer. Using the exposure apparatus for middle layer, each exposure can cover a wide area, thereby reducing the exposure time.

In this case, the size of each shot area of the exposure apparatus for middle layer is for example a multiple of the shot area of the exposure apparatus for critical layer. Therefore, a new shot map for middle layer needs to be produced. However, the time is consumed in producing a completely new shot map and the shot map needs to be consistent with the shot map for critical layer. Then, in the present invention, the region containing the first shot map (FIG. 2A) for critical layer is first defined by the border of the first shot areas forming the first shot map, for example as shown in FIG. 2B. With the border, a shot map is produced in a matrix of rows and columns in units of the second shot areas for the exposure apparatus for middle layer.

After that, in FIG. 2B, non-use areas not contained in the exposure region for critical layer are superimposed for example in each of two horizontal rows, each forming an area equivalent to a second shot area. Then, as shown in FIG. 2C, the second shot areas in the two rows are horizontally shifted by the unit of the first shot area and overflowing shot areas are removed. By this, the number of second shot areas forming the second shot map can be minimized, thereby further improving the throughput.

Where a pattern is formed in each of the first shot areas, the second shot areas forming the second shot map are separated in units of the first shot areas, as described above.

If a plurality of same partial patterns are formed in each of the first shot areas forming the first shot map, for example as shown in FIGS. 5A–5C, patterns formed on the photosensitive substrate are kept same even after shift of the first shot areas by an exposure area of the partial pattern. Accordingly, the second shot areas forming the second shot map can also be separated in units of exposure areas of the partial patterns in the first shot areas forming the first shot map.

If an area corresponding to a second shot area is formed by superimposing non-use areas not contained in the exposure region of the critical layer, for example as shown in FIG. 5B, the second shot areas are horizontally shifted by a partial region. By this, overflowing shot areas can be removed, whereby the number of exposed shot areas can be reduced.

Further, for example as shown in FIGS. 6A–6C, alignment marks for indicating two-dimensional coordinates are formed for example in each first shot area in the first shot map on the photosensitive substrate. In this arrangement, a plurality of first shot areas are contained for example in each of the second shot areas forming the second shot map. Therefore, some sets of alignment marks can be used as the alignment marks. The present invention uses an alignment mark closest to a measurement position of the second exposure apparatus out of the alignment marks within the first shot map, whereby alignment can be made between the second exposure field and each shot area in the second shot map. This can reduce the alignment time in exposures according to the second shot map.

According to the exposure method and the exposure system of the present invention, when a substrate with a critical layer and a middle layer mixed therein is fabricated by the photolithography process, the first exposure apparatus performs exposures according to the first shot map in the critical layer, and the second exposure apparatus with a larger exposure field performs exposures according to the second shot map in the middle layer. This presents such advantages that exposures can be effected in the respective layers each with a necessary resolution even for large-scale substrates and that the exposure time for the middle layer is reduced whereby the throughput of exposure steps becomes higher. Since the second exposure apparatus is of a low resolution, thus being cheap, a cheap system can be constructed as a whole of the used exposure apparatus as compared with the case where another exposure apparatus for critical layer is also used for the middle layer.

Since the second shot map is so set as to minimize the number of shot areas by the second exposure apparatus, the throughput of exposure steps is further improved. In this case, the number of shot areas in the middle layer on a wafer is much smaller than that in the critical layer. Thus, a decrease of one shot area in the middle layer presents an especially greater improvement in throughput than in the case of a decrease of one shot area in the critical layer.

A plurality of same partial patterns are projected in each of the first shot areas forming the first shot map. In this case, each of the second shot areas forming the second shot map is sectioned in units of exposure regions of the partial patterns in the first shot areas forming the first shot map. This can decrease the number of shot areas in the middle layer and can further improve the throughput of exposure steps.

Further, a decrease of the alignment time can be expected by using an alignment mark closest to a measurement position out of the alignment marks in the first shot map during exposures according to the second shot map in the middle layer. In this case, each shot area in the middle layer is a multiple of a shot area in the critical layer. Thus, to optimize a method for selecting the alignment mark so as to reduce a back and forth distance between a measurement position and an exposure position is more effective than where the back and forth distance is reduced in the critical layer.

DESCRIPTION OF THE PREFERRED EMBODIMENTS

The first embodiment of the present invention is described below referring to FIG. 1 to FIG. 3.

FIG. 1 shows an exposure system of the present embodiment. In FIG. 1, there are a stepper 1A of a high resolution and a stepper 1B of a low resolution. In the present embodiment, exposures are effected in the critical layer on the wafer, using the stepper 1A of the high resolution, whereas exposures are effected in the middle layer on the wafer, using the stepper 1B of the low resolution. In the stepper 1A of high resolution, a pattern area 2A on a reticle RA is first illuminated with exposure light from an illumination optical system not shown. A pattern image in the pattern area 2A is demagnified at a ratio of 5:1 by a projection optical system 3A to be projected onto an exposure field 4A on wafer W. Let us define Z1 axis in parallel with the optical axis of the projection optical system 3A, and X1 axis and Y1 axis as an orthogonal coordinate system on a plane perpendicular to the Z1 axis.

The wafer W is held on a wafer stage 5A. The wafer stage 5A consists of a Z stage for setting an exposure surface of wafer W at a best focus position along the Z1 axis, an XY stage for positioning the wafer W in directions along the X1 axis and Y1 axis, etc. Two moving mirrors 6A and 8A are fixed as perpendicular to each other on the wafer stage 5A. A coordinate of wafer stage 5A along X1 is measured by a laser interferometer 7A set outside and the moving mirror 6A, while a coordinate of wafer stage 5A along Y1 is measured by a laser interferometer 9A set outside and the moving mirror 8A. The coordinates measured by the interferometers 7A and 9A are supplied to a control unit 10A for controlling operations of the entire apparatus. The control unit 10A positions the wafer W by step-driving the wafer stage 5A along X1 and Y1 through a drive portion not shown. In this case, the stepping drive of wafer W is carried out according to a layout of shot areas (which are regions each being a unit of projection exposure of the pattern image in the pattern area 2A) set on the exposure surface of wafer W. i.e., according to the shot map for critical layer. This shot map is produced by a map producing portion consisting of a computer in the control unit 10A.

The stepper 1A of the present embodiment is provided with alignment systems 11A and 14A of the TTL (through-the-lens) type and the laser step alignment method (hereinafter referred to as "LSA method"). The alignment system of the LSA method is disclosed in detail in U.S. Pat. No. 4,677,301 (corresponding to Japanese Laid-open Patent Application No. 60-130742), and is briefly described in the following. Namely, a laser beam emitted from the alignment system 11A for X1 axis is reflected by a mirror 12A set between the projection optical system 3A and the reticle RA to enter the projection optical system 3A. The laser beam outgoing from the projection optical system 3A is focused as a slit light spot 13A extending along Y1 in a region near the exposure field 4A.

If an alignment mark (wafer mark) for X1 axis on wafer W is scanned relative to the slit light spot 13A, diffracted light is emergent in a predetermined direction when the wafer mark comes to coincide with the slit light spot 13A. This diffracted light returns via the projection optical system 3A and mirror 12A to the alignment system 11A. A photosensor in the alignment system 11A photoelectrically converts the diffracted light into an alignment signal, which is supplied to the control unit 10A. Sampling a coordinate on X1 axis, of the wafer stage 5A for example when the alignment signal becomes maximum, the control unit 10A detects a position of the wafer mark for X1 axis.

Similarly, a laser beam emitted from the alignment system 14A for Y1 axis of the LSA method is guided via a mirror 15A and the projection optical system 3A to be focused as a slit light spot 16A extending along the X1 axis on wafer W. Diffracted light from the slit light spot 16A returns via the projection optical system 3A and mirror 15A to the alignment system 14A. Using an alignment signal supplied from the alignment system 14A to the control unit 10A, a position of a wafer mark for Y1 axis on wafer W is detected. The alignment system may be an alignment system of the TTR (through-the-reticle) type, or an alignment system of the off-axis type for detecting a position of a wafer mark outside the projection optical system 3A, etc. The method for detecting the wafer mark may be an image processing method, or a so-called double beam interference method in which two beams are projected onto a wafer mark of diffraction grating and position detection is effected from interference signals between a pair of diffracted light beams emerging in parallel with each other, etc.

Next, the low-resolution stepper 1B is constructed substantially in the same structure as the high-resolution stepper 1A. However, a pattern image in a pattern area 2B on a reticle RB is demagnified at a ratio of 2.5:1 through a projection optical system 3B to be projected onto an exposure field 4B on the wafer W held on a wafer stage 5B. Z2 axis is taken in parallel with the optical axis of the projection optical system 3B, and X2 axis and Y2 axis are taken as orthogonal coordinate axes on a plane perpendicular to the Z2 axis. A coordinate of wafer stage 5B on X2 is measured by a moving mirror 6B and a laser interferometer 7B, while a coordinate of wafer stage 5B on Y2 by a moving mirror 8B and a laser interferometer 9B. The coordinates thus measured are supplied to the control unit 10B. The control unit 10B controls stepping drive of wafer stage 5B.

The stepping drive of wafer stage 5B is carried out according to a layout of shot areas (which are regions where the pattern image in the pattern area 2B is projected) set on the exposure surface of wafer W, that is, according to the shot map for middle layer. This shot map is produced by a map producing portion including of a computer in the control unit 10B. In this case, information on the shot map for critical layer, produced in the map producing portion in the control unit 10A provided in the high-resolution stepper 1A, is transmitted from a communication portion in the control unit 10A to a communication portion in the control unit 10B. The map producing portion in the control unit 10B produces a shot map for middle layer based on the information on the shot map for critical layer thus supplied, as detailed later.

In the stepper 1B, a laser beam from an alignment system 11B for X2 axis, of the TTL type and the LSA method is guided via a mirror 12B and the projection optical system 3B to be focused as a slit light spot 13B extending along Y2 on the wafer W. A laser beam from an alignment system 14B for Y2 axis is guided via a mirror 15B and the projection optical system 3B to be focused as a slit light spot 16B extending along X2 on the wafer W. Diffracted light from the slit light spot 13B or 16B is received by the corresponding alignment system 11B or 14B, which detects a position of a wafer mark for Y2 axis or a position of a wafer mark for X2 axis on the wafer W.

Next described is an example of the exposure operation in the present embodiment. In the present embodiment, exposures are first effected in the critical layer on wafer W using the high-resolution stepper 1A, and thereafter exposures are effected in the middle layer on the-wafer W using the low-resolution stepper 1B.

Figure 2A:
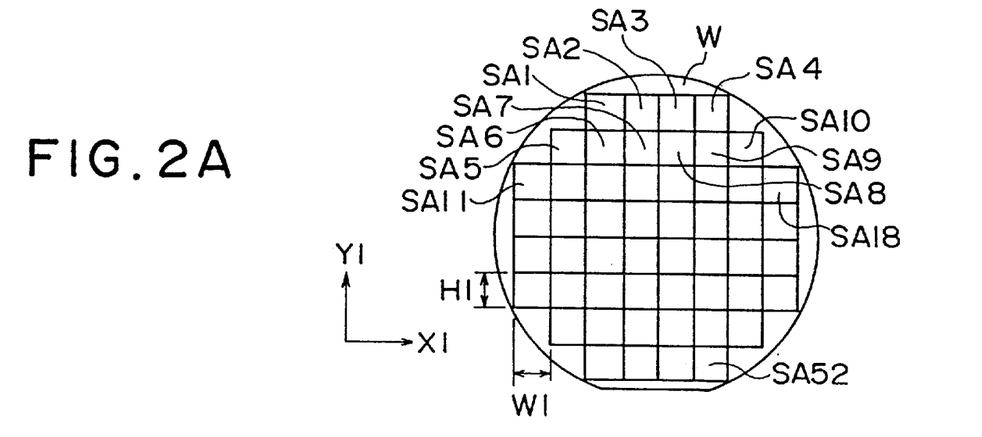
FIG. 2A is a plan view to show a shot map in a critical layer in the first embodiment.
Figure 2B:
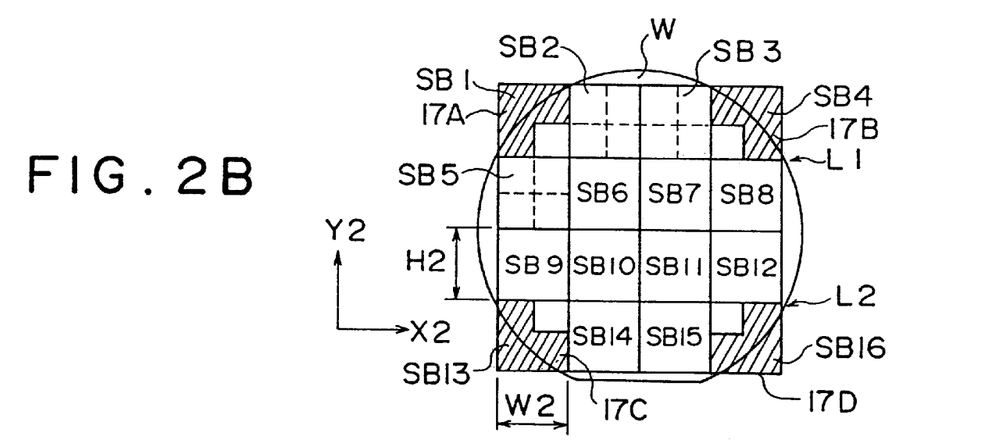
FIG. 2B is a plan view to show a shot map in a middle layer, directly corresponding to FIG. 2A.
Figure 2C:
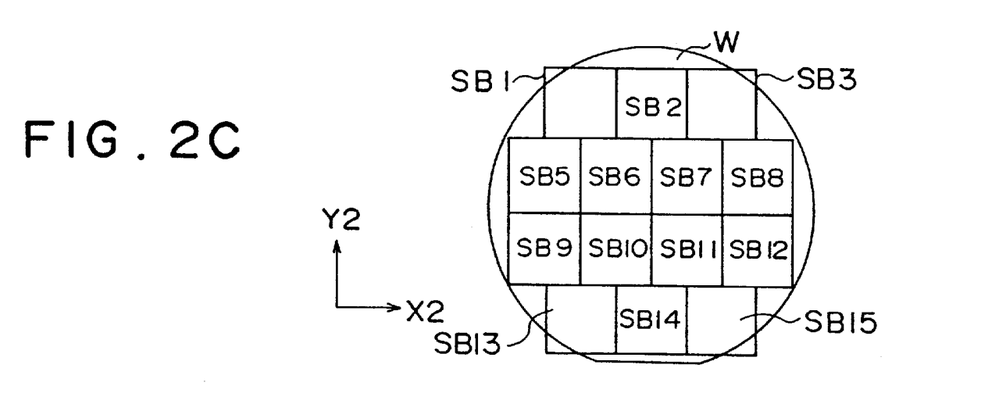
FIG. 2C is a plan view to show a shot map in the middle layer minimized in the number of shot areas.

FIG. 2A shows a general shot map for critical layer on the wafer W. In FIG. 2A, a photoresist-coated exposure surface of wafer W is divided into rectangular shot areas SA1, SA2, . . . , SA52 each in width Wi along X1 and in height H1 along Y1, in the X1 direction and Y1 direction. The pattern image in the pattern area 2A on the reticle RA of FIG. 1 is projected in each of these shot areas SAi (i=1 to 52). A chip pattern image is projected in each shot area SAi in FIG. 2A. The stepper 1A of FIG. 1 step-drives the wafer stage 5A according to the shot map of FIG. 2A, thereby effecting an exposure of the pattern image of reticle RA in each shot area SAi. Further, a chip pattern for critical layer is formed in each shot area SAi through processes including development etc. After that, a photoresist is again applied onto the wafer W and exposures are effected in the middle layer.

In order to improve the throughput of exposure steps, a possible modification is such that a plurality of, for example two, three, or four, same chip pattern images are projected in each shot area SAi and that a plurality of same IC chips are taken out of each shot area SAi.

FIG. 2B shows a shot map for middle layer which is directly conceivable in correspondence to FIG. 2A. In FIG. 2B, the X2 direction and Y2 direction on wafer W correspond to the X1 direction and Y1 direction in FIG. 2A. The exposure surface of wafer W and regions in contact with the exposure surface are divided into rectangular shot areas SB1, SB2, . . . , SB16 each in width W2 (=2•W1) along X2 and in height H2 (=3•H1) along Y2, in the X2 direction and Y2 direction. The pattern image in the pattern area 2B on the reticle RB of FIG. 1 is projected in each of the shot areas SBJ (j=1 to 16).

Namely, each shot area SBj for middle layer has the size including four shot areas SAi for critical layer in total, i.e., two in the X2 direction by two in the Y2 direction. Four same circuit patterns are written in the pattern area 2B on reticle RB of FIG. 1. In FIG. 2B, for example, the shot area SB1 is composed of a shot area SA5 and an extending-off non-use area 17A outside the wafer W. Then, the shot area SB2 is composed of four shot areas SA1, SA2, SA6, SA7. The first shot area SB5 in the second row is likewise composed of four shot areas, the including shot area SA11, . . . The shot areas SB4, SB13, and SB16 at the three other corners each are composed of a shot area for critical layer and a nonuse area 17B–17D.

However, if the non-use areas 17A–17D are superimposed in the X2 direction (or in the Y2 direction) in the shot map of FIG. 2B, a resultant region has the same size as two shot areas for middle layer. As shown in FIG. 2C, the shot areas SB1–SB3 for middle layer in the first row in the X2 direction are shifted by a shot area for critical layer in the X2 direction. Further, the shot areas SB13–SB15 in the fourth row are also shifted by a shot area for critical layer in the X2 direction. At the same time with this, the two shot areas SB4 and SB16 in FIG. 2B are taken away. The shot map for middle layer in FIG. 2C can also fully cover the shot map for critical layer in FIG. 2A, thereby utilizing the exposure surface of wafer W at its maximum.

In the present embodiment, the wafer stage 5B is step-driven according to the shot map of FIG. 2C using the. stepper 1B of FIG. 1 in exposures in the middle layer of wafer W. By this, the pattern image of reticle RB is projected in each of the shot areas SBj (j=1–3, 5–15) on the wafer W. In this case, the number of shot areas in the shot map of FIG. 2C is decreased by two as compared with that in the shot map of FIG. 2B, so that the number of shot areas in the middle layer is minimum, thereby improving the throughput of exposure steps. After that, chip patterns for middle layer are formed as superimposed on the critical layer of wafer W through processes including development etc.

Figure 3:
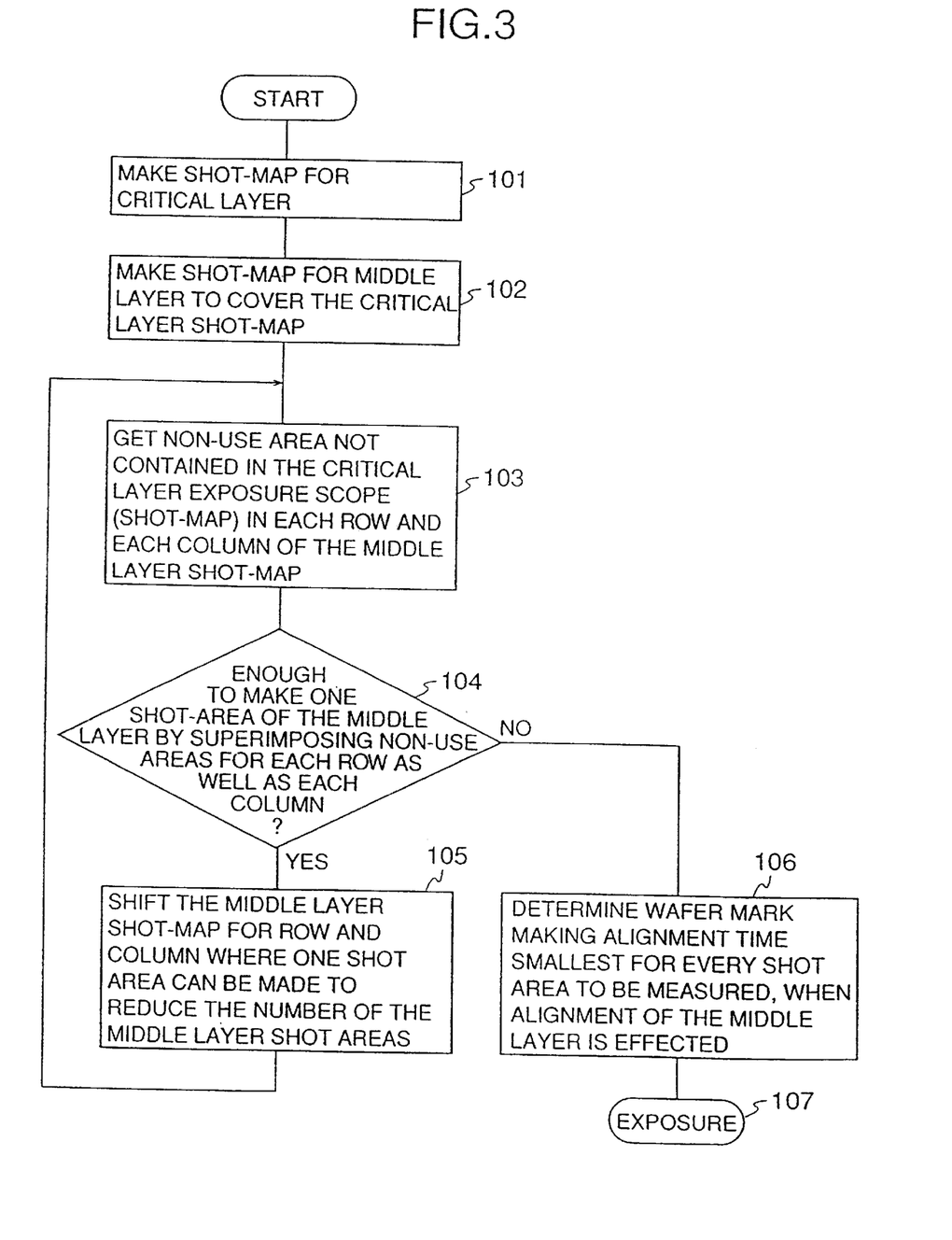
FIG. 3 is a flowchart to show an operation to minimize the number of shot areas in the shot map for middle layer in the first embodiment.

Next described referring to the flowchart of FIG. 3 is an example of algorithm for decreasing the number of shot areas in the shot map for middle layer as described above.

First, at step 101 in FIG. 3, the control unit 10A in FIG. 1 makes the shot map for critical layer as shown in FIG. 2A and supplies information on this shot map to the control unit 10B. Then at step 102, the control unit 10B produces the shot map for middle layer as shown in FIG. 2B so as to cover the shot map for critical layer.

After that, at step 103, the producing portion in the control unit 10B compares the shot map for critical layer with the shot map for middle layer as arranged in a vertically and horizontally regular (or checkered) pattern. Then the control unit obtains non-use areas contained in the exposure scope (shot map) for middle layer but not contained in the exposure scope (shot map) for critical layer. In the case of the example of the shot map for middle layer in FIG. 2B, the four shot areas SB1, SB4, SB13, SB16 at the four corners each include an L-shaped non-use area not included in the exposure scope for critical layer, i.e., the non-use area 17A–17D. At step 104 it is checked whether an exposure scope exceeding one shot area for middle layer can be obtained by superimposing non-use areas in each row or in each column. In the example of FIG. 2B, an exposure scope of one shot area for middle layer can be obtained by superimposing the non-use areas 17A and 17B in the first row or by superimposing the non-use areas 17C and 17D in the fourth row.

Further, watching the row or column containing the exposure scope thus obtained in the above procedures in the shot map for middle layer, the flow proceeds to step 105 if the row or column can be cut apart from the other rows or columns. Then at step 105, the shot areas in the thus separated row or column are shifted in the direction of row or in the direction of column so as to curtail the number of shot areas in the middle layer and then to return to step 103. After that, the operations of steps 103 to 105 are repeated insofar as the number of shot areas in the middle layer can be curtailed, thereby producing the shot map for middle layer in the minimum number of shot areas.

The example of FIG. 2B is so arranged that at step 104, the border in contact with the non-use areas 17A, 17B in the shot map for middle layer is a straight line L1 and the border in contact with the non-use areas 17C, 17D is a straight line L2. Thus, the operation proceeds to step 105. Then the arrays of shot areas in the first row and the fourth row are shifted to match with the exposure scope for critical layer, thereby curtailing the number of shot areas in the middle layer.

On the other hand, if an area corresponding to one shot area for middle layer cannot be secured with superposition of non-use areas in each row or each column at step 104, the flow proceeds to step 106. Then wafer marks as measuring objects are determined so as to minimize the alignment time in exposure in the middle layer. A specific example of the operation at step 106 is described hereinafter. Then at step 107, exposures (including alignment) are made in the middle layer.

Using the above algorithm, the data of the shot map for middle layer using a minimum number of shots can be automatically produced from the already obtained data of the shot map for critical layer.

In the embodiment of FIGS. 2A–2C, a shot area for middle layer (for example SB1) has the size including two shot areas in the X2 direction and two shot areas in the Y2 direction, thus four (=2×2) shot areas for critical layer (for example SA1) in total. The size of a shot area for middle layer can be arbitrarily set insofar as it is an integral multiple of a shot area for critical layer in the X2 direction and an integral multiple of a shot area in the Y2 direction. For example, depending upon the shape or size of shot areas SAi for critical layer and on a projection magnification of projection optical system 3B, the width W2 along X2 and the height H2 along Y2, of the shot areas SBj for middle layer may be set to be 2•W1 and 3•H1, respectively. Also, the width W2 and height H2 may be set to be 3•W1 and 2•H1, respectively. Once the size of shot areas for middle layer is set as described, the shot map for middle layer is automatically produced along the flow of FIG. 3.

The example of FIG. 2A shows an example in which a chip pattern is taken out of each shot area SAi for critical layer, but it is also possible that a plurality of chip patterns different from each other are taken out of each shot area SCi. In this case the producing method of shot map for middle layer is similar to that in the above embodiment.

The second embodiment of the present invention is next described referring to FIGS. 4A, 4B and FIGS. 5A–5C. The first embodiment as described above is applicable to cases where a chip pattern is formed in each shot area in the critical layer. The present embodiment, however, is directed to cases where a plurality of chip patterns are formed in each shot area in the critical layer.

Figure 4A:
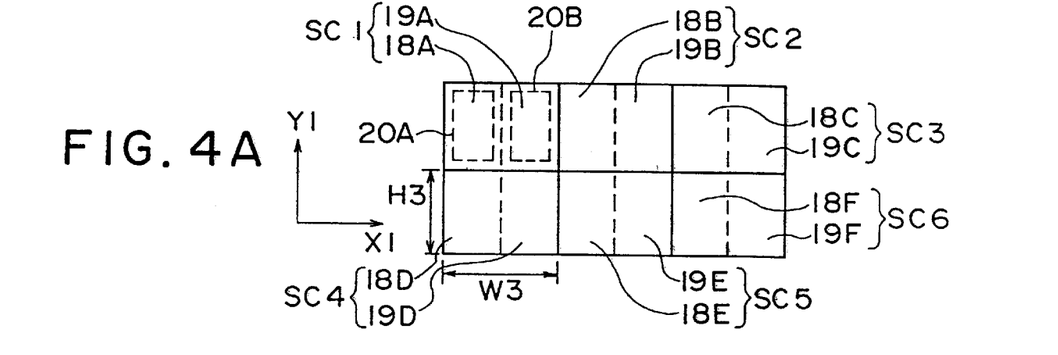
FIG. 4A is an enlarged plan view to show a part of a shot map for critical layer in a second embodiment of the present invention.

FIG. 4A shows an example of the shot map for critical layer in the present embodiment. In FIG. 4A, shot areas SC1–SC6 for critical layer each in width W3 along X1 and in height H3 along Y1 are regularly arranged in a matrix of two rows by three columns. Each shot area SC1 to SC6 is divided into two partial shot areas 18A–18F and 19A–19F. A same chip pattern is formed in each of these partial shot areas 18A–18F and 19A–19F.

For example, same chip patterns 20A and 20B are formed in two partial shot areas 18A and 19A, respectively, in the shot area SC1. This means that the same patterns are projected in the partial shot areas 18A–18F and 19A–19F in the critical layer and in the middle layer. Accordingly, the shot areas in the middle layer do not have to be divided in units of the shot areas SC1 to SC6 in the critical layer, but may be divided in units of the partial shot areas 18A–18F and 19A–19F.

Figure 4B:
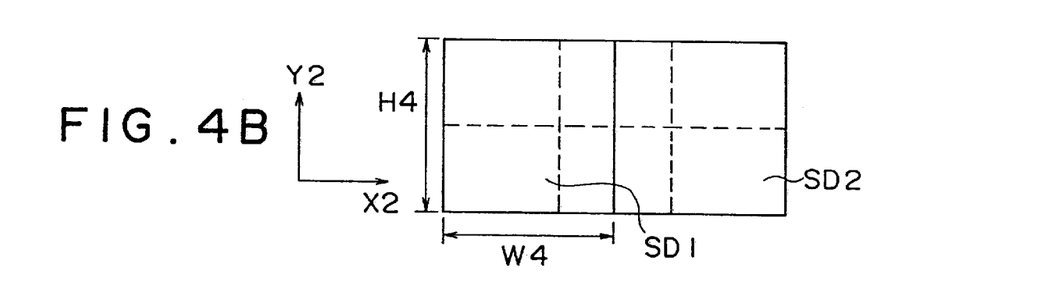
FIG. 4B is an enlarged plan view to show shot areas in the middle layer, corresponding to FIG. 4A.

FIG. 4B shows an example of the shot map for middle layer, corresponding to FIG. 4A. In this FIG. 4B, there are two shot areas SD1 and SD2 arranged in the X2 direction each in width W4 (=1.5•W3) along X2 and in height H4 (=2•H3) along Y2. These two shot areas SD1 and SD2 cover six shot areas in the critical layer as shown in FIG. 4A. Namely, the shot area SD1 in the middle layer is set 1.5 times wider in the X2 direction and 2 times longer in the Y2 direction than the shot area in the critical layer. In this case, six same circuit patterns are written in the reticle for middle layer.

Determining the shot map for middle layer as shown in FIG. 4B, desired chip patterns can be produced with a high throughput. It should be noted that the width in the X2 direction, of the shot area SD1 in the middle layer can be set 2 times, 2.5 times, or 3 times ect. . . . the width W3 of the shot area SC1 in the critical layer.

Next described is an example of the shot map on an actual wafer W. First, the upper half of the shot map for critical layer is one as shown in FIG. 5A. In FIG. 5A, shot areas SC1 to SC34 for critical layer each in width W3 along X1 and in height H3 along Y1 are regularly arranged in the X1 direction and Y1 direction on the wafer W. Each shot area SCi (i=1–34) is composed of two partial shot areas 18A ect. . . . and 19A ect. . . . in which a same chip pattern is formed. Accordingly, two chip patterns are taken out of each shot area SCi. Further, hatched partial shot areas 18H (the left half of shot area SC8) and 19P (the right half of shot area SC16) are non-use exposure regions, because they extend off outside the exposure region of wafer W.

In this case, a shot map for middle layer directly derived in correspondence to the shot map of FIG. 5A is one as shown in FIG. 5B. In FIG. 5B, shot areas SE1 to SE10 each in width W5 (=2•W3) along X2 and in height H5 (=2•H3) along Y2 are regularly arranged in the region covering the shot map for critical layer of FIG. 5A. Each shot area SEj (j=1–10) has the size including two shot areas SCi for critical layer in the X2 direction and two shot areas SCi for critical layer in the Y2 direction. Also, the hatched regions in FIG. 5B are non-use areas 21A, 21B, and 21C not contained in the exposure region excluding the non-use shot areas 18H and 19P from the shot map for critical layer of FIG. 5A.

In this case, the number of shot areas in the middle layer cannot be curtailed by the method of shifting the shot areas SE1 to SE5 in the first row for middle layer by the unit of shot area for critical layer as in the first embodiment. In the case of FIG. 5A, however, two chip patterns are taken out of one shot area SCi for critical layer. Because of this arrangement, the shot areas SEj for middle layer can be shifted by the unit of the partial shot area (for example 18A, 19A).

Thus, when the shot areas SE1 to SE5 in the first row are shifted by a partial shot area in the X2 direction, i.e., by a half of W3 in the X2 direction in FIG. 5B, the shot map of FIG. 5C is obtained. In this case, the entire shot area SE5 becomes a non-use area and therefore the shot area SE5 is omitted to show. Accordingly, using the shot map of FIG. 5C, the number of shot areas in the middle layer can be curtailed by one, thereby improving the throughput of exposure steps.

The algorithm for decreasing the number of shot areas for middle layer is the same as that of FIG. 3. Namely, the shot map for middle layer in FIG. 5B is compared with the shot map for critical layer in FIG. 5A, and it is then checked whether one shot area for middle layer can be secured by superimposing peripheral left and right or upper and lower non-use areas 21A–21C for middle layer in each row or column. If an exposure scope of at least one shot area can be secured by combination, the number of shot areas for middle layer can be minimized by shifting the shot areas for middle layer in that row or column by the unit of the partial shot area (for example 18A, 19A) for critical layer.

Information on the number and layout of the partial shot areas (18A, 19A etc.) present in the shot areas SCi for critical layer is transferred to the producing portion for automatically producing the shot map for middle layer. This can optimize automatic production of the shot map for middle layer using the shot map for critical layer.

The example of FIG. 5A shows the case where two chip patterns are taken out of one shot area SCi in the critical layer. It is also possible that three or more same chip patterns are taken out of each shot area SCi for critical layer.

The third embodiment of the present invention is next described referring to FIGS. 6A–6C. Described in detail in the present embodiment is an example of the method for determining wafer marks used in alignment at step 106 in FIG. 3.

FIG. 6A shows an example of layout of wafer marks in the shot map for critical layer in FIG. 2A. FIG. 6B shows a shot area SB2 in the shot map for middle layer, corresponding to FIG. 6A. Accordingly, each shot area in the middle layer includes four shot areas for critical layer. In FIG. 6A, there are wafer marks WX1, WX2, WX6, WX7 for X1 direction and wafer marks WY1, WY2, WY6, WY7 for Y1 direction in respective shot areas SA1, SA2, SA6, SA7 regularly arranged. The wafer marks WX1 to WX7 are dot patterns arranged at a predetermined pitch in the Y1 direction and the wafer marks WY1 to WY7 are dot patterns arranged at a predetermined pitch in the X1 direction. These wafer marks are detected by the alignment systems of the LSA method.

Here, for alignment in exposures in the critical layer, slit light spots 13A and 16A as shown in FIG. 6A are projected from the alignment systems 11A and 14A of the LSA method in the stepper 1A of FIG. 1. Then, scanning the wafer mark WX1 relative to the slit light spot 13A in the X1 direction and scanning the wafer mark WX1 relative to the slit light spot 16A in the Y1 direction, positions of wafer marks WX1 and WY1 are detected. In the critical layer a set of wafer marks are put in each shot area (SA1 etc.). Thus, in order to detect coordinates of each shot area, a necessary step is that positions of wafer marks in the shot area are detected.

In contrast, for alignment in exposures in the middle layer, as shown in FIG. 6B, four wafer marks WX1, WX2, WX6, WX7 for X2 direction and four wafer marks WY1, WY2, WY6, WY7 for Y2 direction are formed in a shot area SB2. For measuring positional coordinates of the shot area SB2, it is sufficient to detect positions just of a set of wafer marks out of the four sets of wafer marks. Thus, for producing the shot map for middle layer, it is necessary to determine which wafer marks are used out of the plurality of wafer marks. In this example, alignment is carried out for example for each shot area in the middle layer. Namely, alignment is carried out by the die-by-die method, and optimization is made so as to minimize the time necessary for alignment in each shot area as at step 106 in FIG. 3.

FIG. 6C shows an effective exposure field 23B of the projection optical system 3B in the stepper 1B for middle layer in FIG. 1. The effective exposure field 23B is an exposure region by the projection optical system 3B including the exposure field 4B of FIG. 1. The shot area SB2 in the middle layer is set at the center exposure position 24B in the effective exposure field 23B. In the peripheral portion of the effective exposure field 23B, the slit light spots 13B and 16B are projected from the alignment systems 11B and 14B of the LSA method in FIG. 1.

The alignment of the shot area SB2 in the middle layer is not done at the exposure position 24B of shot area SB2. The alignment in the Y2 direction is made at the position of slit light spot 16B on the right side of the exposure position 24B, while the alignment in the X2 direction is at the position of the slit light spot 13B above the exposure position 24B. In the sequence of the die-by-die method performing alignment for each shot area, back and forth movement is needed between the exposure position 24B and the slit light spot 13B, 16B as an alignment position for each shot area.

Therefore, selecting a wafer mark closest to the irradiation position of slit light spot 13B or 16B in each of the X2 direction and the Y2 direction, the alignment time can be minimized using the wafer marks for critical layer in exposures in the middle layer. In the case of FIG. 6C, either one of two upper wafer marks WX1, WX2 in the critical layer is selected for alignment in the X2 direction, and either one of two right wafer marks WY2, WY7 in the critical layer is selected for alignment in the Y2 direction. In automatically producing the shot map for middle layer from the shot map for critical layer, the alignment time at each alignment position is calculated, and the wafer marks are selected so as to minimize the alignment time.

Where the border of the shot areas in the middle layer is not coincident with the border of the shot areas in the critical layer as shown in FIGS. 4A–4B or where after optimization is effected so as to minimize the number of shot areas in the middle layer in units of the partial shot areas as shown in FIG. 5C, the border of the shot areas in the critical layer deviates from the border of the shot areas in the middle layer, and therefore the wafer marks do not always exist at same positions in each shot area in the middle layer. In this case, the alignment sequence is produced by changing positions of the wafer marks every shot area in the middle layer. In automatically producing the shot map, an optimum sequence is produced by specifically determining the wafer mark positions and calculating the alignment time every shot area.

In actual processes there is a possibility that a selected wafer mark has a defect and alignment is impossible with the selected wafer mark. In that case, another wafer mark can be used within a shot area in the middle layer. Concerning this, where the shot map for middle layer is automatically produced and positions of used wafer marks are input, it is preferable to assign priorities to the wafer marks used in alignment so as to minimize the time necessary for a sequence performed under an assumption that there are defects.

Further, there is another method for detecting for example two wafer marks in the X2 direction and two wafer marks in the Y2 direction in alignment of shot area SB2 in the middle layer for example in FIG. 6B. By this, rotation or linear expansion and contraction etc. can be measured in addition to the coordinate position of shot area SB2, thereby enhancing the registration accuracy between different layers. For detecting positions of a plurality of wafer marks for each axis in alignment of a predetermined shot area in the middle layer as described, there are some ways of combinations for measuring wafer marks. It is also preferable in this case that a combination is chosen so as to minimize the alignment time. Also, combinations with priorities may be recorded in the data of the shot map for middle layer automatically produced.

The above embodiments employed the steppers as exposure apparatus. However, the present invention can be applied to cases where the projection exposure apparatus of the so-called step-and-scan method or the projection exposure apparatus of the slit scan method are used as exposure apparatus, thereby improving the throughput of exposure steps.

It is thus noted that the present invention is by no means limited to the embodiments as described above, but may involve a variety of arrangements within the scope not departing from the essence of the present invention.

What is claimed is:

1. An exposure system comprising:
   a first exposure apparatus having a first exposure field;
   a second exposure apparatus having a second exposure field larger than said first exposure field;
   a first shot map forming unit provided in said first exposure apparatus, which forms a first shot map by dividing an exposure region on a photosensitive substrate in units of first shot areas each corresponding to said first exposure field;
   a control unit which transfers information on said first shot map to said second exposure apparatus; and
   a second shot map forming unit provided in said second exposure apparatus, which forms a second shot map, based on the information on said first shot map, so that a number of shots becomes minimum when an exposure region including said first shot map on said photosensitive substrate is divided in second shot areas each corresponding to said second exposure field.

2. An exposure system according to claim 1, wherein said first and second exposure apparatuses use a step-and-scan method or a slit scan method.

3. A method of producing an apparatus which performs a second exposure to superimpose a second pattern on a first pattern formed on a substrate by a first exposure, the method comprising:
   providing a memory which stores information on a first shot map of a plurality of first shot areas formed on said substrate by said first exposure and information on a size of said first shot area;
   providing a memory which stores information on a size of a second shot area, a plurality of said second shot areas being formed on said substrate by said second exposure; and
   providing a calculation portion which prepares a second shot map for forming said second shot areas based on said information on said first shot map, said size of said first shot area, and said size of said second shot area,
   wherein first shot areas formed on a periphery of said substrate are non-linearly arranged.

4. A method according to claim 3, wherein said calculation portion prepares said second shot map to minimize a number of second shot areas.

5. A method according to claim 3, wherein a line width of said first pattern differs from a line width of said second pattern.

6. A method according to claim 3, wherein said calculation portion prepares said second shot map to minimize an unexposed field in said first exposure contained in said second shot map.

7. A method according to claim 3, wherein said size of said second shot area is larger than said size of said first shot area.

8. A method according to claim 3, wherein said apparatus uses a step-and-scan method or a slit scan method.

9. For use with a separate first exposure apparatus, a second exposure apparatus, comprising:
   a mask stage which holds a mask;
   a substrate stage which holds a substrate;
   a projection optical system, disposed between said mask stage and said substrate stage, that projects a pattern of a mask; and
   a controller, connected to the substrate stage, that controls an exposure based on a shot layout of the substrate which is determined per chip from information related to a chip structure and a chip size of the mask pattern, wherein the mask pattern comprises a plurality of chip patterns, each shot area of the substrate has a plurality of chip patterns having been formed thereon through an exposure process with the first exposure apparatus, and the shot layout is determined so that the number of shots with the second exposure apparatus is reduced.

10. A second exposure apparatus according to claim 9, wherein the shot layout is recorded prior to the exposure and said controller controls the exposure in accordance with the recorded shot layout.

11. A second exposure apparatus according to claim 9, wherein said first and second exposure apparatuses perform first and second exposures, and wherein a size of a second shot area in said second exposure is larger than a size of a first shot area in said first exposure.

12. A second exposure apparatus according to claim 9, wherein said second exposure apparatus uses of a step-and-scan method or a slit scan method.

13. A method for making a second exposure apparatus for use with a separate first exposure apparatus, comprising:
   providing a mask stage which holds a mask;
   providing a substrate stage which holds a substrate;
   providing a projection optical system, disposed between said mask stage and said substrate stage, that projects a pattern of a mask; and
   providing a controller, connected to the substrate stage, that controls an exposure based on a shot layout of the substrate which is determined per chip from information related to a chip structure and a chip size of the mask pattern, wherein the mask pattern comprises a plurality of chip patterns, each shot area of the substrate has a plurality of chip patterns having been formed thereon through an exposure process with the separate first exposure apparatus, and the shot layout is determined so that the number of shots with the second exposure apparatus is reduced.

14. A method according to claim 13, wherein said second exposure apparatus uses of a step-and-scan method or a slit scan method.

15. An apparatus which performs a second exposure to superimpose a second pattern on a first pattern formed on a substrate by a first exposure, the apparatus comprising:

a memory which stores information on a first shot map of a plurality of first shot areas formed on said substrate by said first exposure and information on a size of said first shot area;

a memory which stores information on a size of a second shot area, a plurality of said second shot areas being formed on said substrate by said second exposure; and a calculation portion which prepares a second shot map for forming said second shot areas based on said information on said first shot map, said size of said first shot area, and said size of said second shot area so that the number of shots with said apparatus is reduced.

16. An apparatus according to claim 15, wherein a line width of said first pattern differs from a line width of said second pattern.

17. An apparatus according to claim 15, wherein said calculation portion prepares said second shot map to minimize an unexposed field in said first exposure contained in said second shot map.

18. An apparatus according to claim 15, wherein said apparatus uses a step-and-scan method or a slit scan method.

19. A method of producing an apparatus which performs a second exposure to superimpose a second pattern on a first pattern formed on a substrate by a first exposure, the method comprising:

providing a memory which stores information on a first shot map of a plurality of first shot areas formed on said substrate by said first exposure and information on a size of said first shot area;

providing a memory which stores information on a size of a second shot area, a plurality of said second shot areas being formed on said substrate by said second exposure; and providing a calculation portion which prepares a second shot map for forming said second shot areas based on said information on said first shot map, said size of said first shot area, and said size of said second shot area so that the number of shots with said apparatus is reduced.

20. A method according to claim 19, wherein a line width of said first pattern differs from a line width of said second pattern.

21. A method according to claim 19, wherein said calculation portion prepares said second shot map to minimize an unexposed field in said first exposure contained in said second shot map.

22. A projection exposure apparatus which performs a second exposure for a substrate on which a first exposure has already been effected, one shot area of said first exposure including M partial areas, wherein M is an integer equal to or greater than 1, comprising:

a projection system, disposed in a path of an exposure beam, which projects an image to one side thereof;

a stage system, at least a part of the stage system being disposed on the one side of the projection system, which holds and moves the substrate; and a control system, associated with said stage system, which controls said stage system for said second exposure, in accordance with positional information of marks selected among a plurality of marks formed in said first exposure, one shot area of said second exposure including N partial areas, wherein N is an integer equal to or greater than 1, and N is not equal to M.

23. An apparatus according to claim 22, wherein said N is greater than M.

24. An apparatus according to claim 22, further comprising a detecting system which detects the positional information.

25. An apparatus according to claim 22, wherein information on a rotation is obtained based on the positional information of the marks.

26. An apparatus according to claim 22, wherein said control system controls said stage system so as to reduce an overlap error between the partial areas in said first exposure and corresponding partial areas in said second exposure is.

27. An apparatus according to claim 22, wherein said second exposure is performed using a scanning exposure method.

28. An apparatus according to claim 22, wherein said first exposure is performed using an exposure apparatus separate from said projection exposure apparatus.

29. An apparatus according to claim 22, wherein said control system controls said stage system based on the positional information on marks which are selected taking into account a difference between a boundary of the shot areas in the first exposure and a boundary of the shot areas in the second exposure.

30. An apparatus according to claim 22, wherein said control system controls said stage system based on the positional information on marks which are selected taking into account a shot layout in said second exposure.

31. An apparatus according to claim 30, wherein said control system controls said stage system based on the positional information on marks which are selected taking into account a shot layout in said second exposure.

32. An apparatus according to claim 30, wherein said shot layout is determined so as to reduce the number of the shot areas in said second exposure.

33. An exposure system comprising:

a first exposure apparatus which exposes each of a plurality of first shot areas on a substrate with a first pattern;

a second exposure apparatus which exposes the substrate formed with the first pattern with a second pattern; and a first controller electrically connected to said first exposure apparatus and said second exposure apparatus, which transfers information of a first shot map of a plurality of the first shot areas formed on said substrate to said second exposure apparatus.

34. The exposure system according to claim 33, wherein said first controller is provided in said first exposure apparatus.

35. The exposure system according to claim 34, wherein said second exposure apparatus has a second controller which receives said information of said first shot map transferred by said first controller.

36. The exposure system according to claim 35, wherein said second controller prepares information of a second shot map for forming a plurality of second shot area onto the substrate by said second exposure apparatus, based on the information of said first shot map.

37. The exposure system according to claim 36, wherein said second controller prepares said information of the second shot map based on size information of said first shot area and size information of said second shot area.

38. The exposure system according to claim 36, wherein said second controller prepares said information of the second shot map arranged so that a number of shots therein becomes minimum when a region including said first shot map is divided into second shot areas.

39. The exposure system according to claim 36, wherein said first shot exposure apparatus has a first exposure field and each of said first shot areas corresponds to said first exposure field, and wherein said second exposure apparatus has a second exposure field and each of said second shot areas corresponds to said second exposure field, the size of said first exposure field being different from the size of said second exposure field.

40. The exposure system according to claim 39, wherein the size of said first exposure field is smaller than the size of said second exposure field.

41. An apparatus which has a predetermined exposure field and which exposes a plurality of shot areas on a substrate with a predetermined pattern comprising:
a shot map data generating unit which generates shot map data where an exposure region on said substrate is divided in units of shot areas each corresponding to said predetermined exposure field; and
a controller electrically connected to said shot map data generating unit, which transfers said shot map data to outside of said apparatus.

42. The apparatus according to claim 41, wherein said controller transfers said shot map data to an exposure apparatus.

43. The apparatus according to claim 42, wherein said exposure apparatus to which said shot map data are transferred also has a predetermined exposure field, and sizes of the exposure fields are different from one another.

44. The exposure apparatus according to claim 43, wherein the size of said exposure field of said exposure apparatus to which said shot map data are transferred is larger than the size of the other exposure field.

45. An apparatus which, serving as a second exposure apparatus, performs a second exposure to superimpose a second pattern on a first pattern formed on a substrate by a first exposure apparatus, comprising:
a receiving unit which receives first shot map data of a plurality of first shot areas formed on said substrate by said first exposure apparatus; and
a memory electrically connected to said receiving unit, which stores said shot map data received by said receiving unit.

46. The apparatus according to claim 45, further comprising a controller electrically connected to said memory, which generates second shot map data to be used for forming a plurality of second shot areas on the substrate by said second exposure apparatus, based on said first shot map data.

47. The apparatus according to claim 46, wherein said memory stores size information of said first shot area and size information of said second shot area, and said controller generates said second shot map data based on both of said size information.

48. The apparatus according to claim 46, wherein said controller generates said second shot map data so that the number of shots with the second exposure apparatus is reduced.

49. The apparatus according to claim 45, wherein said receiving unit receives said first shot map data from said first exposure apparatus.

50. The apparatus according to claim 45, wherein said second exposure apparatus and said first exposure apparatus have respective exposure fields, and sizes of the exposure fields are different from one another.

51. The apparatus according to claim 50, wherein the size of said exposure field of said second exposure apparatus is larger than the size of said exposure field of said first exposure apparatus.

52. An exposure system comprising:
a first exposure apparatus which exposes each of a plurality of first shot areas on a substrate with a first pattern;
a second exposure apparatus which exposes the substrate formed with the first pattern with a second pattern; and
a controller electrically connected to said first exposure apparatus and said second exposure apparatus, which prepares, based on information of a first shot map of a plurality of the first shot areas formed on said substrate by said first exposure apparatus, information of a second shot map for forming a plurality of second shot areas on the substrate by said second exposure apparatus.

53. The exposure system according to claim 52, wherein said controller generates said information of the second shot map arranged so that a number of shots therein becomes minimum when a region including said first shot map is divided into second shot areas.

54. The exposure system according to claim 53, wherein said controller generates said information of the second shot map based on size information of said first shot area and size information of said second shot area.

55. The exposure system according to claim 53, wherein said first exposure apparatus has a first exposure field and each of said first shot areas corresponds to said first exposure field, and wherein said second exposure apparatus has a second exposure field and each of said second shot areas corresponds to said second exposure field, the size of said first exposure field being different from the size of said second exposure field.

56. The exposure system according to claim 55, wherein the size of said first exposure field is smaller than the size of said second exposure field.

57. The exposure system according to claim 52, wherein said controller receives said information of the first shot map from said first exposure apparatus.

58. The exposure system according to claim 52, wherein said controller is provided in said second exposure apparatus.

59. A method of manufacturing an apparatus which has a predetermined exposure field and which exposes a plurality of shot areas on a substrate with a predetermined pattern, comprising:
providing a shot map data generating unit which generates shot map data where an exposure region on said substrate is divided in units of shot area each corresponding to said predetermined exposure field; and
providing a controller electrically connected to said shot map data generating unit, which transfers said shot map data to outside of said apparatus.

60. The method according to claim 59, wherein said controller transfers said shot map data to an exposure apparatus.

61. The method according to claim 60, wherein the exposure apparatus to which said shot map data are transferred also has a predetermined exposure field, and sizes of the exposure fields are different from one another.

62. The method according to claim 61, wherein the size of said exposure field of said exposure apparatus to which said shot map data are transferred is larger than the size of the other exposure field.

63. A method of manufacturing an apparatus which, serving as a second exposure apparatus, performs a second exposure to superimpose a second pattern on a first pattern formed on a substrate by a first exposure apparatus, comprising:

providing a receiving unit which receives first shot map data of a plurality of first shot areas formed on said substrate by said first exposure apparatus; and providing a memory electrically connected to said receiving unit, which stores said shot map data received by said receiving unit.

64. The method according to claim 63, further comprising:

providing a controller electrically connected to said memory, which generates second shot map data to be used for forming a plurality of second shot areas on the substrate by said second exposure apparatus, based on said first shot map data.

65. The method according to claim 64, wherein said controller generates said second shot map data so that the number of shots with the second exposure apparatus is reduced.

66. The method according to claim 63, wherein the size of said exposure field of said second exposure apparatus is different from the size of said exposure field of said first exposure apparatus.

67. The method according to claim 66, wherein the size of said exposure field of said second exposure apparatus is larger than the size of said exposure field of said first exposure apparatus.

* * * * *